(12) United States Patent
Yoon

(10) Patent No.: US 6,238,985 B1
(45) Date of Patent: May 29, 2001

(54) SEMICONDUCTOR DEVICE AND METHOD FOR FABRICATING THE SAME

(75) Inventor: Gyu Han Yoon, Chungcheongbuk-do (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/310,334

(22) Filed: May 12, 1999

Related U.S. Application Data (62) Division of application No. 08/957,622, filed on Oct. 24, 1997, now Pat. No. 5,952,700.

(30) Foreign Application Priority Data

Sep. 16, 1997 (KR) .................................................. 97/46038

(51) Int. Cl.$^7$ .................................................. H01L 21/336
(52) U.S. Cl. .................. 438/286; 438/217; 438/286; 438/287; 438/306; 438/563; 438/591; 438/216; 438/545; 438/546
(58) Field of Search .................................. 438/216, 217, 438/286, 287, 306, 591, 563, 371, FOR 188, FOR 191, FOR 324, FOR 193, FOR 190, FOR 202, 545, 546; 257/411

(56) References Cited

U.S. PATENT DOCUMENTS

| | | | |
|---|---|---|---|
| 3,855,610 | 12/1974 | Masuda et al. | 257/405 |
| 4,746,624 | 5/1988 | Cham et al. | 438/305 |
| 5,407,870 | * 4/1995 | Okada et al. | |
| 5,441,906 | * 8/1995 | Burger | |
| 5,451,807 | 9/1995 | Fujita | 257/404 |
| 5,801,416 | 9/1998 | Choi et al. | 257/335 |
| 5,897,354 | * 4/1999 | Kachelmeier | |
| 5,956,588 | * 9/1999 | Choi et al. | |

FOREIGN PATENT DOCUMENTS

| | | | |
|---|---|---|---|
| 3-30475 | 2/1991 | (JP) | 257/411 |
| 4-177765 | 6/1992 | (JP) | 257/411 |
| 6-151833 | 5/1994 | (JP) | 257/411 |
| 6-232416 | 8/1994 | (JP) | 257/411 |

\* cited by examiner

*Primary Examiner*—George Fourson
*Assistant Examiner*—Joannie A. Garcia
(74) *Attorney, Agent, or Firm*—Morgan, Lewis & Bockius LLP (57) ABSTRACT

A semiconductor device is disclosed, including: a semiconductor substrate; a gate electrode formed on the semiconductor substrate; a first gate insulating layer formed between the gate electrode and semiconductor substrate, and formed at a first region including one edge of the gate electrode; a second gate insulating layer formed between the gate electrode and semiconductor substrate, and formed at a second portion including the other edge of the gate electrode, the second gate insulating layer being thicker than the first gate insulating layer; a first impurity region formed in a predetermined portion of the semiconductor substrate, placed on both sides of the gate electrode; and a second impurity region formed in a predetermined portion of the semiconductor substrate, placed under the second gate insulating layer.

9 Claims, 8 Drawing Sheets

SEMICONDUCTOR DEVICE AND METHOD FOR FABRICATING THE SAME

This is a divisional of application Ser. No. 08/957,622 filed on Oct. 24, 1997, now U.S. Pat. No. 5,952,700.

BACKGROUND OF THE INVENTION

1. Field of the Invention

The present invention relates to a semiconductor device, specifically, to a semiconductor device and method of fabricating the same, which improves its driving power and reliability.

2. Discussion of Related Art

The MOS technology, where the surface of silicon is treated with a silicon oxide layer having good insulation characteristics, remarkably improves the transistor characteristic and transistor fabrication process. There are PMOS, NMOS and CMOS in MOS devices. At the earlier stage, the PMOS device is widely used because it has lower consumption power and its fabrication process is easily controlled during the manufacture of integrated circuit. However, in an integrated circuit requiring high speed, the NMOS device replace the PMOS. This is because the carrier (electron) mobility of the NMOS is faster than the carrier (hole) mobility of the PMOS device by approximately 2.5 times.

Though the CMOS device is fabricated through process more complicated than that for forming the PMOS or NMOS device, its consumption power is very low. Accordingly, the NMOS device is used for the memory region of a semiconductor device, and CMOS device is used for its periphery circuit. Meanwhile, the size of MOS device, especially, the channel length, is gradually reduced as the semiconductor device becomes highly integrated and high-speed. As a result, the distance between the source and drain is decreased but the device still uses the conventional power voltage of 5V. This increases the electric field intensity in the MOS device.

On the reduction of channel length, the carrier obtains high energy from the electric field while it moves from the source to the channel, and it's temperature when it reaches the drain is much higher than that of the lattice around it. Accordingly, impact ionization due to the carrier occurs. This becomes a problem in the NMOS device rather than in the PMOS because electrons are easily impact-ionized than holes. Among electron-hole pairs generated from the impact ionization, the electrons move to the drain of n-type impurity region but holes move to the substrate of p-type impurity region in the NMOS device. The flow of holes creates substrate current. Some holes move to the source, so that the p-n junction becomes forward-biased, creating NPN transistor. This increases the amount of current, and thus impact ionization effect is raised, resulting in high drain current.

When the carrier in the channel is accelerated by the high electric field around the drain, and thus its energy becomes higher than the energy barrier between the substrate and gate oxide layer, the carrier becomes hot electron and is inserted into the gate oxide layer. The electron or hole inserted into the gate oxide layer is trapped in the gate oxide layer, and forms a potential on the interface between the substrate and gate oxide layer. This changes the threshold voltage, or decreases mutual conductance. This phenomenon is called hot carrier effect, which is resulted from the high electric field generated at the pinch-off region around the drain. To improve the hot carrier effect, an LDD structured MOS transistor has been proposed, in which a low concentration layer having a gentle impurity concentration profile is formed between the drain and channel, to decrease the high electric field.

With this LDD structure, a self-aligned lightly doped impurity region (LDD region) is located between the channel region, and heavily doped impurity regions (source and drain regions) placed on both sides of the channel region. The LDD region spreads the high electric field around the drain junction. Thus, the carrier supplied from the source is not rapidly accelerated even with a high voltage. This solves the hot carrier problem. However, the resistance of the LDD region serves as parasitic resistance because the concentration of the LDD region is lower (approximately ⅟1000) than that of the source and drain regions, resulting in reduction of driving current. The increase in the impurity concentration of the LDD region raises the substrate current, heightening the hot carrier effect. However, the reduction of the LDD region's concentration decreases the driving current under the influence of the parasitic resistance.

Accordingly, it is required that the concentration of the LDD region is high, and easily controlled. There is a method to meet this requirement, in which the LDD region is formed on both sides of a gate electrode through ion implantation using the gate electrode as a mask, sidewall spacers are formed on the sides of the gate electrode using an oxide layer, and ion implantation is carried out using the sidewall spacers and gate electrode as a mask, to form heavily doped source and drain regions. With this LDD structure, the LDD region is formed on the source side as well as drain side. As a result, the LDD region formed between the heavily doped source region and channel region creates higher sheet resistance, and increases the total resistance of the channel. This brings about the reduction in the driving current of MOS device, deteriorating the driving power of MOS transistor.

In addition to, there is a MOSFET structure having a pocket region which is deeply formed around the channel, and surrounds the LDD region of the source and drain regions, to thereby prevent punchthrough. A conventional method of fabricating the semiconductor device described above is explained below with reference to the attached drawings. FIGS. 1A to 1F are cross-sectional views showing a method of fabricating the conventional MOSFET.

Figure 1A:
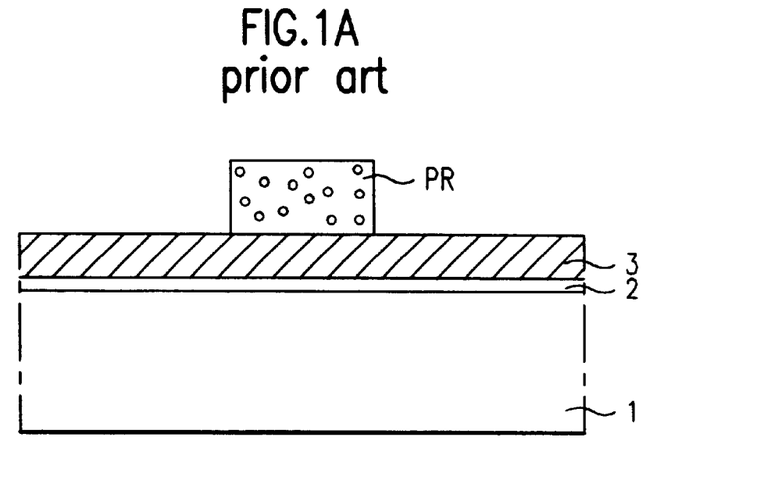
FIGS. 1A to 1F are cross-sectional views showing a conventional method of fabricating a MOSFET.
Figure 1B:
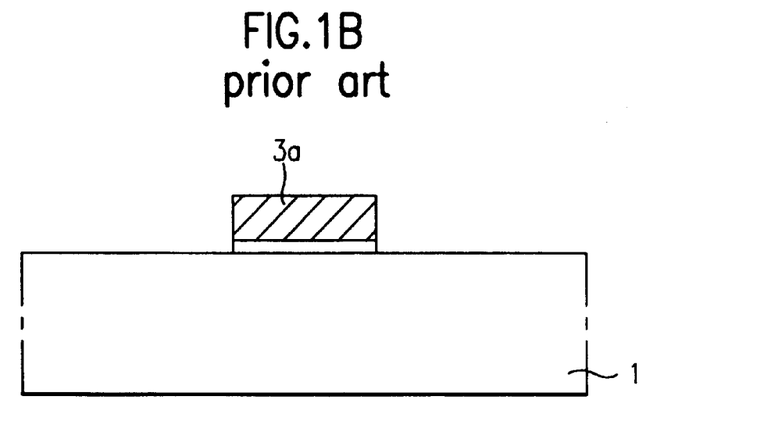

Referring to FIG. 1A, a gate oxide layer 2 and polysilicon layer 3 are sequentially formed on a p-type semiconductor substrate 1, photoresist is coated on polysilicon layer 3 and patterned through exposure and development, to define a gate electrode formation region. Referring to FIG. 1B, polysilicon layer 3 and gate oxide layer 2 are selectively removed through etching process using the patterned photoresist as a mask, to form a gate electrode 3a.

Figure 1C:
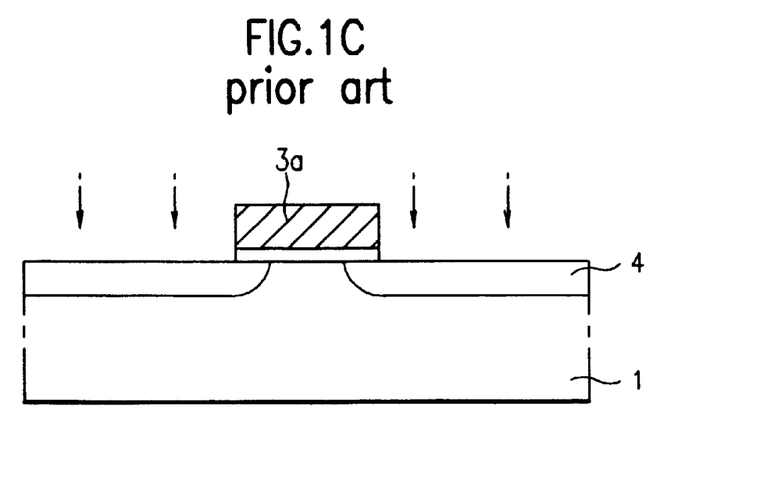

Referring to FIG. 1C, n-type lightly doped impurity regions 4 are formed on predetermined portions of p-type semiconductor substrate 1, placed on both sides of gate electrodes 3a, by ion implantation using gate electrode 3a as a mask. This impurity region 4 corresponds to a conventional LDD region, which prevents the hot carrier effect due to impact ionization. Lightly doped impurity regions 4 are symmetrically formed in the portions of semiconductor substrate 1, placed on both sides of gate electrode 3a. Furthermore, lightly doped impurity regions 4 are diffused in the substrate during ion implantation and heat treatment, thereby being superposed on a predetermined portion of gate electrode 3a.

Figure 1D:
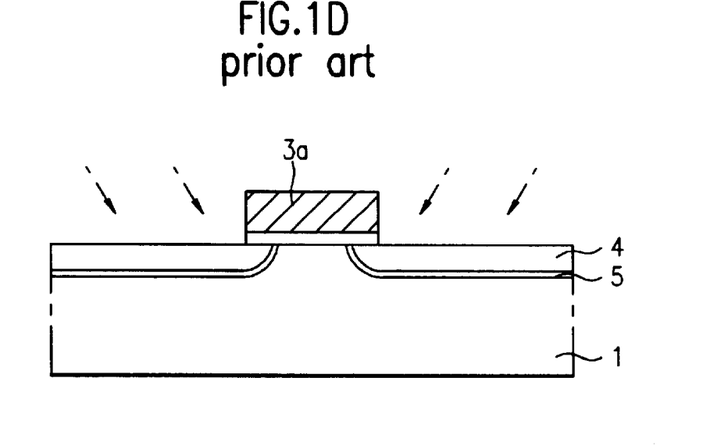
Figure 1E:
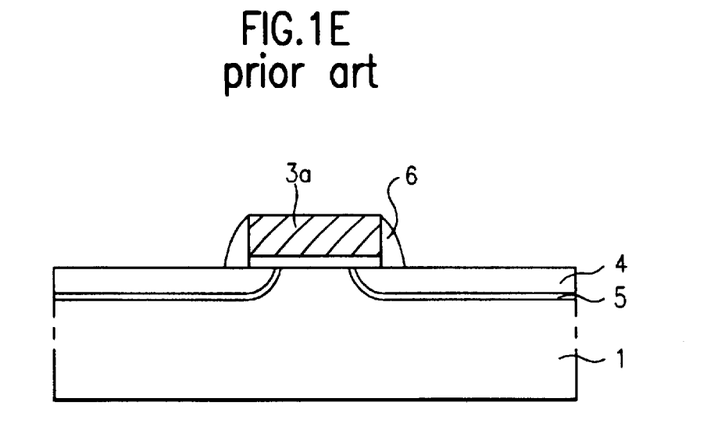

Referring to FIG. 1D, p-type lightly doped impurity regions 5 are formed in predetermined portions of semiconductor substrate 1, placed on both sides of gate electrode 3a, through tilt ion implantation using gate electrode 3a as a mask, and heat treatment. Here, p-type lightly doped impurity regions 5 are formed deeper than n-type lightly doped impurity regions 4, thus surrounding n-type regions 4. Referring to FIG. 1E, an oxide layer is formed on the overall surface of the substrate including gate electrode 3a, and etched back, to form sidewall spacers 6 on both sides of the gate electrodes.

Figure 1F:
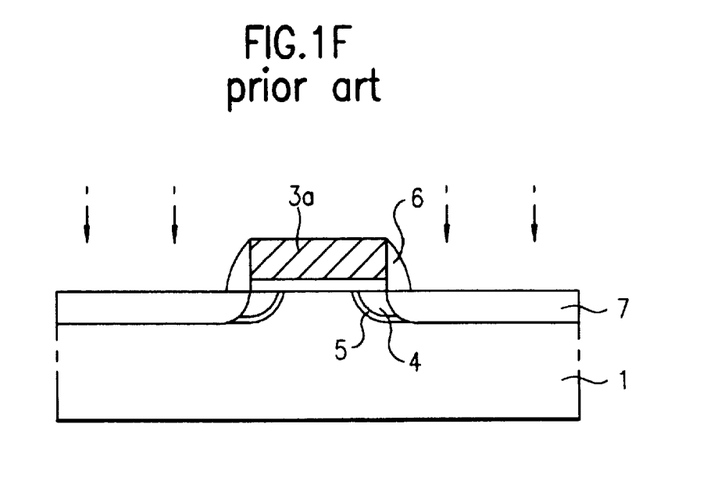

Referring to FIG. 1F, n-type heavily doped impurity regions 7 are formed in predetermined portions of substrate 11, placed on both sides of gate electrode 3a and sidewall spacer 6, through high-concentration impurity ion implantation using gate electrode 3a and sidewall spacer 7 as a mask, and heat treatment, thereby accomplishing a MOSFET having a pocket shaped LDD region, in which p-type lightly doped impurity region 5 having a conductivity is identical to that of the substrate surrounds n-type lightly doped region 4 whose conductivity is opposite to that of the substrate.

There are problems in the above-described conventional MOS device having an LDD region or pocket shaped LDD region. That is, since the LDD region is symmetrically formed on the side of the source and drain regions, the LDD region formed on the side of the source increases the sheet resistance, raising the total resistance of the MOSFET. Thus, the driving power of MOS is decreased, and its reliability is also lowered. Furthermore, the pocket shaped LDD region is formed through tilt ion implantation, resulting in the deterioration of productivity of semiconductor device.

SUMMARY OF THE INVENTION

Accordingly, the present invention is directed to a semiconductor device and method of fabricating the same that substantially obviates one or more of the problems due to limitations and disadvantages of the related art.

An object of the present invention is to provide a semiconductor device and method of fabricating the same, which forms an unsymmetrical LDD region structure where the LDD region is formed only on the side of drain region, to improve the driving power and reliability of the MOS device.

To accomplish the object of the present invention, there is provided a semiconductor device including: a semiconductor substrate; a gate electrode formed on the semiconductor substrate; a first gate insulating layer formed between the gate electrode and semiconductor substrate, and formed at a first region including one edge of the gate electrode; a second gate insulating layer formed between the gate electrode and semiconductor substrate, and formed at a second portion including the other edge of the gate electrode, the second gate insulating layer being thicker than the first gate insulating layer; a first impurity region formed in a predetermined portion of the semiconductor substrate, placed on both sides of the gate electrode; and a second impurity region formed in a predetermined portion of the semiconductor substrate, placed under the second gate insulating layer.

To accomplish the object of the present invention, there is provided a method of fabricating a semiconductor device, including the steps of: forming a first gate insulating layer on a semiconductor substrate, and forming a second gate insulating layer on one side of the first gate insulating layer, the second gate insulating layer being thicker than the first gate insulating layer; forming a gate electrode on the first and second gate insulating layers, one side of the gate electrode corresponding to the first gate insulating layer and its other side corresponding to the second gate insulating layer; and forming first impurity regions in predetermined portions of the semiconductor substrate, placed on both sides of the gate electrode, and forming a second impurity region in a predetermined portion of the semiconductor substrate, placed under the second gate insulating layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 2:
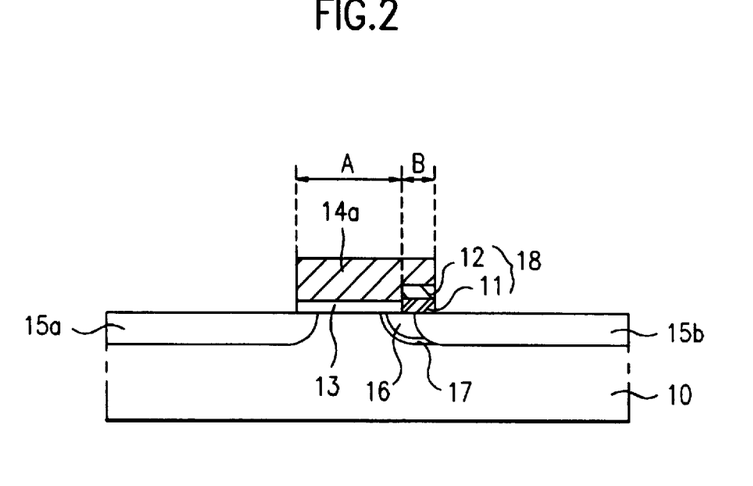
FIG. 2 is a cross-sectional view of a MOSFET according to the present invention.

FIG. 2 is a cross-sectional view of a MOSFET according to the present invention. Referring to FIG. 2, the MOSFET of the present invention includes: a semiconductor substrate 10; a gate electrode 14a formed on semiconductor substrate 10; a first gate insulating layer 13 formed between semiconductor substrate 10 and gate electrode 14a, and formed at a first region A including one edge of gate electrode 14a; a second gate insulating layer 18 formed between semiconductor substrate 10 and gate electrode 14a, and formed at a second region B including the other edge of gate electrode 14a, the second gate insulating layer 18 being formed thicker than the first gate insulating layer 13; first impurity regions 15a and 15b formed in predetermined portions of semiconductor substrate 10, placed on both sides of gate electrode 14a; and a second impurity region 16 formed in a predetermined portion of semiconductor substrate 10, placed under second gate insulating layer 18.

Second gate insulating layer 18 is formed of an insulating material containing impurity ions. Second gate insulating layer 18 consists of a first insulating layer 11 coming into contact with semiconductor substrate 10, and second insulating layer 12 formed on first insulating layer 11. First insulating layer 11 is formed from an insulating layer doped with an impurity whose conductivity is identical to that of semiconductor substrate 10, and second insulating layer 12 is formed from an insulating layer doped with an impurity whose conductivity is opposite to that of the substrate. That is, when semiconductor substrate 10 is p-type, first insulating layer 11 is, for example, formed from an insulating layer doped with a p-type impurity such as boron (B) or indium (In), and second insulating layer 12 is formed from an insulating layer doped with an n-type impurity such as phosphorus (P) or arsenic (As). When semiconductor substrate 10 is n-type, the first insulating layer is formed of an insulating layer doped with an n-type impurity, and the second insulating layers are formed from an insulating layer doped with a p-type impurity.

First gate insulating layer 13 is wider than second gate insulating layer 18. That is, first region A is wider than second region B. First impurity regions 15a and 15b are heavily doped impurity regions having conductivity opposite to that of semiconductor substrate 10, and serve as source and drain regions. Second impurity region 16 is formed in low concentration in the portion of semiconductor substrate 10, placed between first impurity regions 15a and 15b, and has conductivity identical to that of the first impurity region. Especially, second impurity region 16 comes into contact with first impurity region 15b serving as the drain region. That is, second impurity region 16 serves as an LDD region for preventing the hot carrier effect. A third impurity region 17 is formed in a predetermined portion of semiconductor substrate 10, which comes into contact with second impurity region 16. Third impurity region 17 has conductivity opposite to that of second impurity region 16. Third impurity region 17 surrounds one side and bottom of second impurity region 16.

Figure 3A:
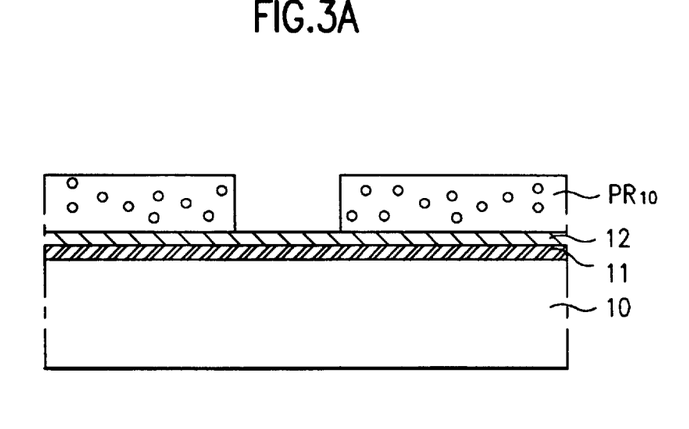
FIGS. 3A to 3H are cross-sectional views showing a method of fabricating a MOSFET according to the first embodiment of the present invention.

A method of fabricating the MOSFET according to the first embodiment of the present invention is explained below with reference to FIGS. 3A to 3H. Referring to FIG. 3A, first and second insulating layers 11 and 12 are sequentially formed on semiconductor substrate 10, a first photoresist layer PR10 is coated thereon and patterned through exposure and development to define a channel region in a predetermined portion of the substrate, thereby being left on a region other than the channel region.

First insulating layer 11 is formed from an insulating layer doped with an impurity having conductivity identical to that of semiconductor substrate 10, and second insulating layer 12 is formed from an insulating layer doped with an impurity having conductivity opposite to that of semiconductor substrate 10. That is, when semiconductor substrate 10 is p-type, first insulating layer 11 is, for example, formed from an insulating layer doped with a p-type impurity such as B or In, and second insulating layer 12 is formed from an insulating layer doped with an n-type impurity such as P or As.

When semiconductor substrate is n-type, first insulating layer 11 is, for example, formed from an insulating layer doped with an n-type impurity such as P or As, and second insulating layer 12 is formed from an insulating layer doped with a p-type impurity such as B or In. First and second insulating layers 11 and 12 may be formed of one layer. In this case, the one layer is formed of an insulating layer doped with an impurity whose conductivity is opposite to that of the substrate.

Figure 3B:
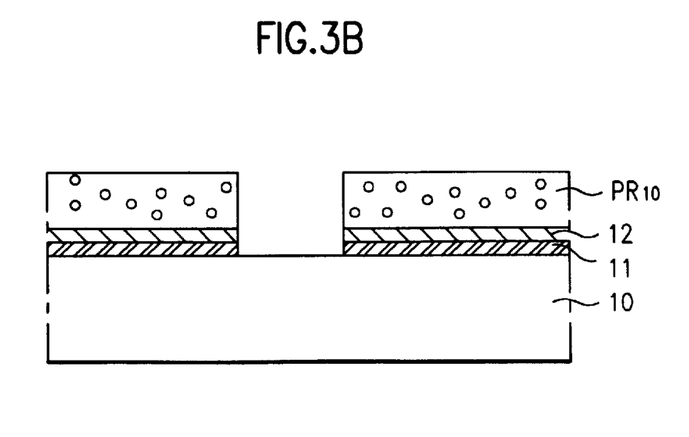
Figure 3C:
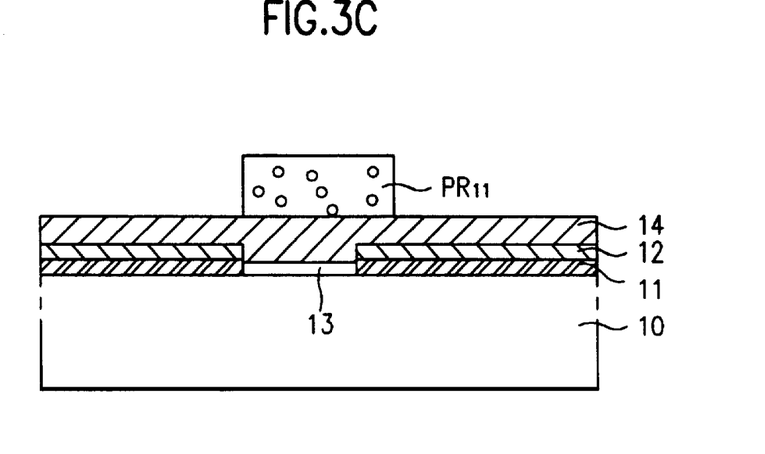

Referring to FIG. 3B, second and first insulating layer 12 and 11 are selectively removed by etching process using patterned first photoresist layer PR10 as a mask, to expose the surface of semiconductor substrate. Referring to FIG. 3C, first photoresist layer PR10 is removed, and first gate insulating layer 13 is formed on the exposed portion of semiconductor substrate 10. A polysilicon layer 14 is formed on the overall surface of second insulating layer 12 including first gate insulating layer 13. Subsequently, a second photoresist layer PR1 is coated on polysilicon layer 14, and patterned through exposure and development, to define a gate electrode region.

Here, the gate electrode region covers the overall surface of first gate insulating layer 13, and a predetermined portion of second insulating layer 12, placed on one side of first gate insulating layer 13. First gate insulating layer 13 is formed of one of oxide layer and nitride layer. When the oxide layer is used as first gate insulating layer 13, it is formed in such a manner that the exposed portion of semiconductor substrate 10 is thermally oxidized at the ambient of $O_2$ or $2H_2O$. The thickness of first gate insulating layer 13 is similar to that of first insulating layer 11.

Figure 3D:
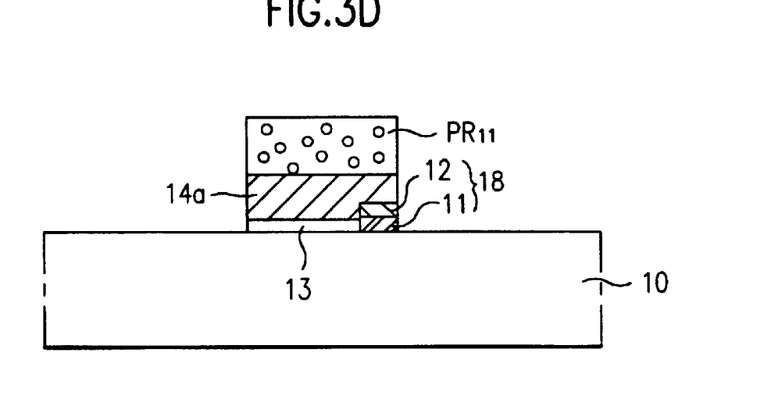

Referring to FIG. 3D, polysilicon layer 14, second insulating layer 12 and first insulating layer 11 are etched by etching process using patterned second photoresist layer PR11 as a mask, to form gate electrode 14a. One edge of gate electrode 14a is superposed on second insulating layer 12. First and second insulating layer 11 and 12 placed under one edge of gate electrode 14a form second gate insulating layer 18 narrower than first gate insulating layer 13.

Figure 3E:
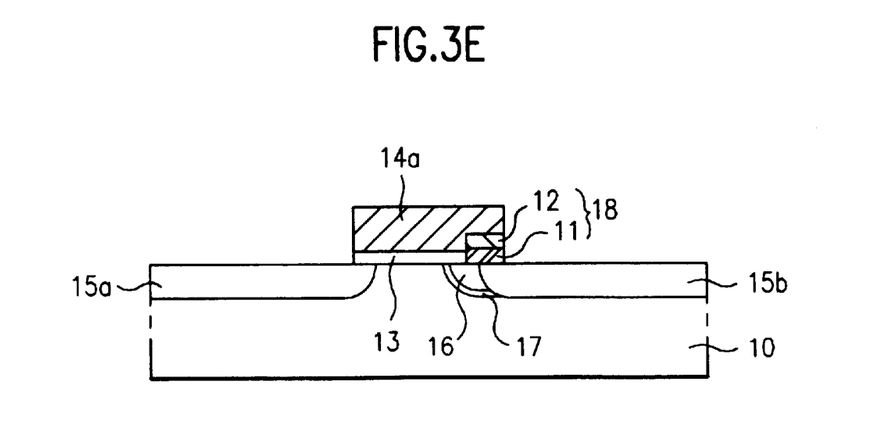

Referring to FIG. 3E, second photoresist layer PR11 is removed. Then, high-concentration impurity ions having conductivity opposite to that of semiconductor substrate 10 are implanted into portions of the substrate, placed on both sides of gate electrode 14a, using gate electrode 14a as a mask, and annealing process is carried out, to form source and drain regions 15a and 15b serving as heavily doped impurity regions. Here, source and drain regions 15a and 15b will be called a first impurity region. With the annealing process, impurity ions doped in second insulating layer 12 forming the upper portion of second gate insulating layer 18 are solid-phase diffused into semiconductor substrate 10, to form second impurity region 16 in the semiconductor substrate. Second impurity region 16 has conductivity opposite to that of the substrate.

Furthermore, impurity ions doped in first insulating layer 11 are also solid-phase diffused, to form third impurity region 17 in a portion of substrate 10 surrounding second impurity region 16. Impurity ions doped in first insulating layer 11 coming into contact with semiconductor substrate 10 is diffused into the substrate wider and deeper than those doped in second insulating layer 12. Thus, a pocket structured impurity region is formed, in which third impurity region 17 selectively covers second impurity region 16.

Second and third impurity regions 16 and 17 have impurity concentration lower (approximately 1/1000) than that of the first insulating layer of heavily doped source and drain regions 15a and 15b. Second and third impurity regions 16 and 17 are conventional LDD regions. Second and third impurity regions 16 and 17 are not formed symmetrically in the portions of semiconductor substrate 10, placed on both sides of gate electrode 14a, but formed in the portion under one edge of gate electrode 14a. By doing so, the MOSFET having unsymmetrical LDD region is formed. These unsymmetrical LDD regions (second and third impurity regions 16 and 17) are formed to come into contact with drain region 15b.

Figure 3F:
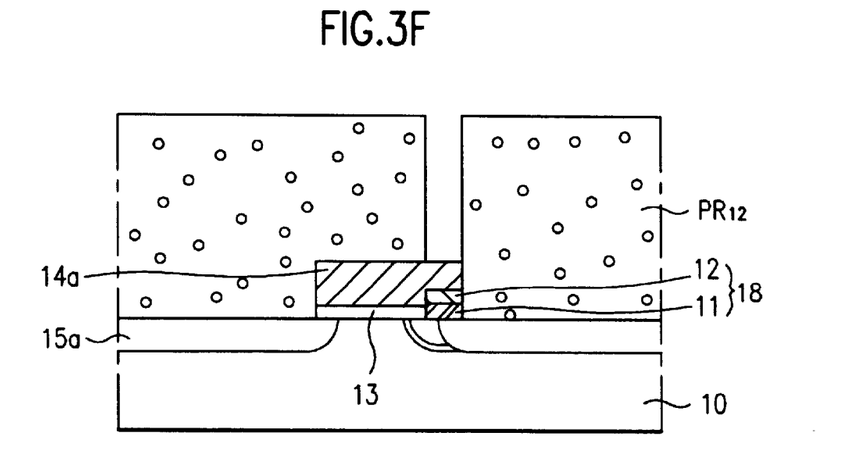
Figure 3G:
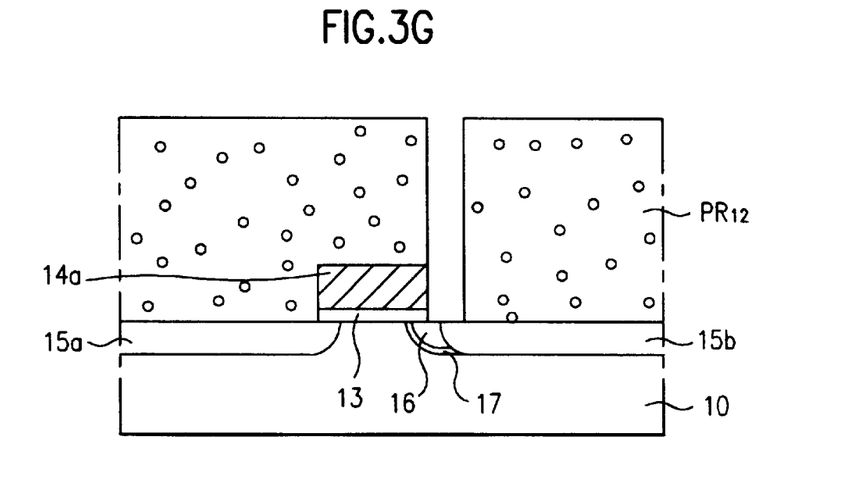
Figure 3H:
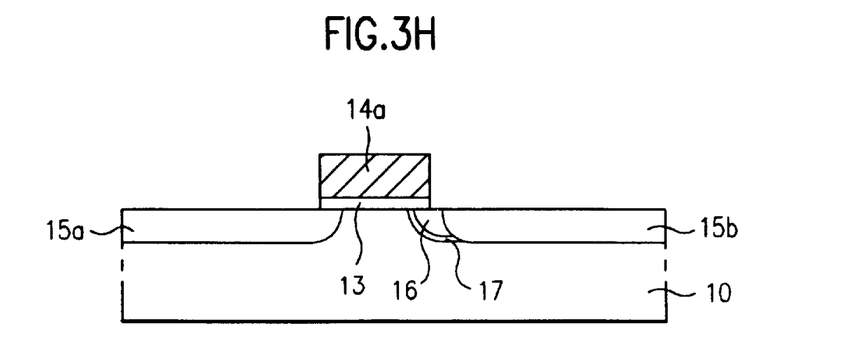

Referring to FIG. 3F, a third photoresist layer PR12 is coated on the overall surface of the substrate including gate electrode 14a, and patterned through exposure and development, to expose a portion of gate electrode 14a, placed on second gate insulating layer 18. Referring to FIG. 3G, the portion of gate electrode 14a and second gate insulating layer 18 are removed by etching process using third photoresist layer PR12 as a mask. Referring to FIG. 3G, third photoresist layer PR12 is removed, thereby finishing the MOSFET according to the first embodiment of the present invention. The process of removing the portion of gate electrode 14a shown in FIGS. 3F, 3G and 3H may be omitted.

FIGS. 4A to 4H are cross-sectional views showing a process of fabricating a MOSFET according to the second embodiment of the present invention. In this process, the first gate insulating layer is formed, and then the first and second insulating layers are formed.

Figure 4A:
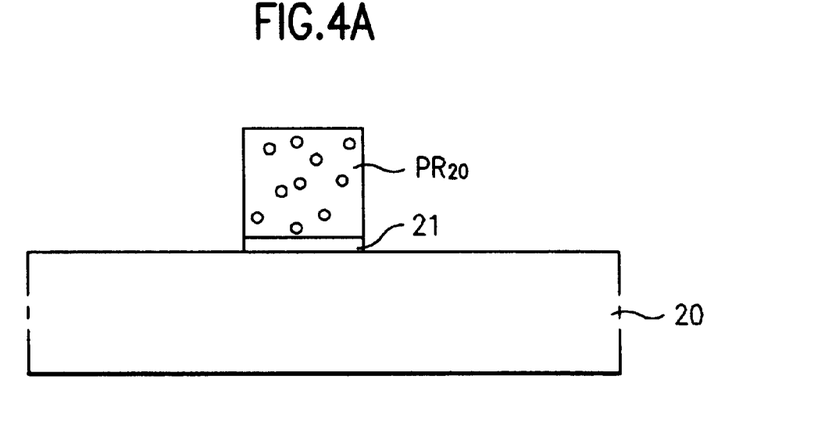
FIGS. 4A to 4H are cross-sectional views showing a method of fabricating a MOSFET according to the second embodiment of the present invention.
Figure 4B:
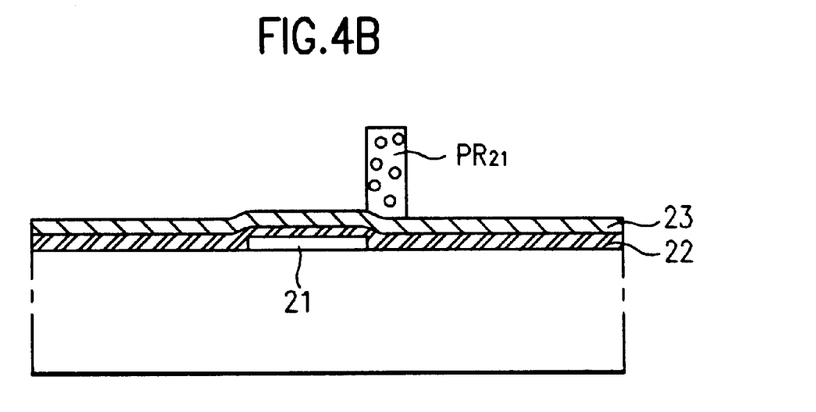

Referring to FIG. 4A, a first gate insulating layer 21 is formed on a semiconductor substrate 20, and a first photoresist layer PR20 is coated thereon. First photoresist layer PR20 is patterned through exposure and development to define a channel region, thereby being left on the channel region. First gate insulating layer 21 is selectively removed by etching process using first photoresist layer PR20 as a mask. Referring to FIG. 4B, first photoresist layer PR20 is removed. First and second insulating layers 22 an 23 are sequentially formed on the overall surface of semiconductor substrate 20 including first gate insulating layer 21, and a second photoresist layer PR21 is coated thereon. Second photoresist layer PR21 is patterned through exposure and development, to be left on a predetermined portion of second insulating layer 23, having a predetermined distance from one side of first gate insulating layer 21.

First insulating layer 22 is formed from an insulating layer doped with an impurity having conductivity identical to that of semiconductor substrate 20, and second insulating layer 23 is formed from an insulating layer doped with an impurity having conductivity opposite to that of semiconductor substrate 20. That is, when semiconductor substrate 20 is p-type, first insulating layer 22 is, for example, formed from an insulating layer doped with a p-type impurity such as B or In, and second insulating layer 23 is formed from an insulating layer doped with an n-type impurity such as P or As.

When the semiconductor substrate is n-type, first insulating layer 22 is, for example, formed from an insulating layer doped with an n-type impurity such as P or As, and second insulating layer 23 is formed from an insulating layer doped with a p-type impurity such as B or In. First and second insulating layers 22 and 23 may be formed of one layer. In this case, the one layer is formed of an insulating layer doped with an impurity whose conductivity is opposite to that of the substrate.

Figure 4C:
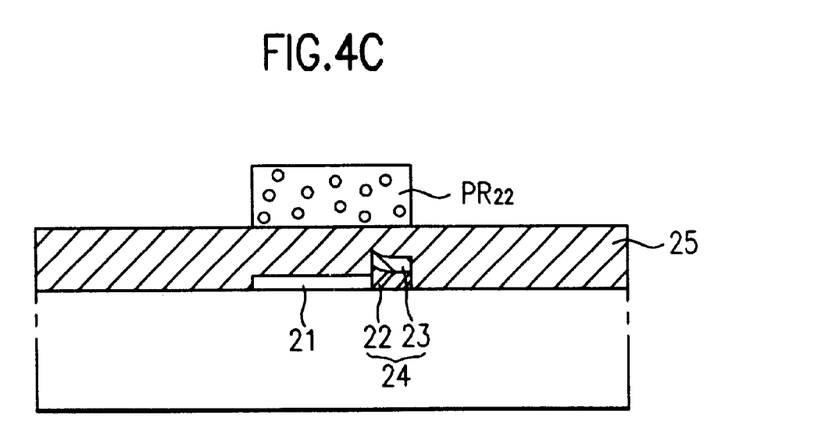

Referring to FIG. 4C, second and first insulating layers 23 and 22 are selectively removed by etching process using patterned second photoresist layer PR21 as a mask, to form a second gate insulating layer 24 consisting of first and second insulating layers 22 and 23, on one side of first gate insulating layer. Second photoresist layer PR21 is removed. Thereafter, a polysilicon layer 25 is formed on the overall surface of the substrate including first and second gate insulating layers 21 and 24, and a third photoresist layer PR22 is coated thereon. Third photoresist layer PR22 is patterned through exposure and development, to be left on a portion of polysilicon layer 25, placed on first and second insulating layers 21 and 24.

Figure 4D:
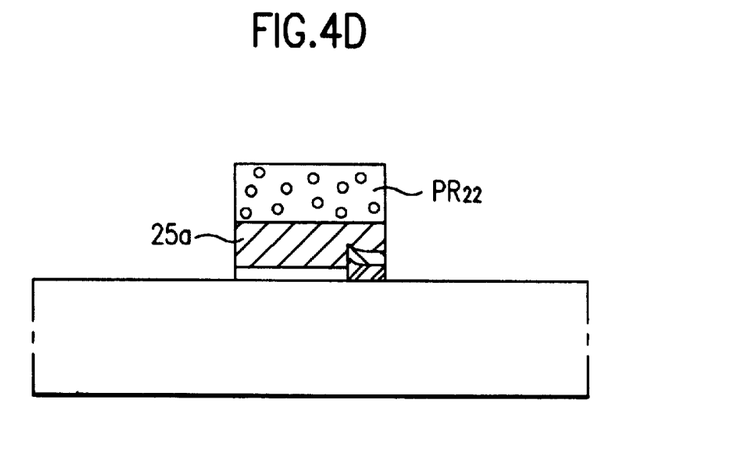
Figure 4E:
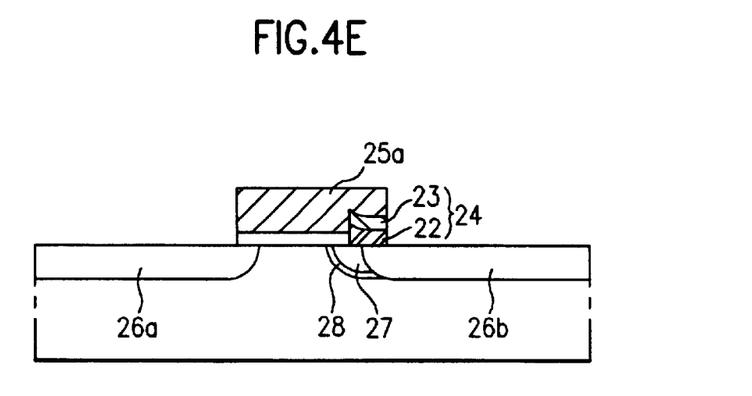

Referring to FIG. 4D, polysilicon layer 25 is selectively removed by etching process using patterned third photoresist layer PR22 as a mask, to form a gate electrode 25a. Referring to FIG. 4E, third photoresist layer PR22 is removed. Then, high-concentration impurity ions having conductivity opposite to that of semiconductor substrate 20 are implanted into portions of the substrate, placed on both sides of gate electrode 25a, using gate electrode 25a as a mask, and annealing process is carried out, to form source and drain regions 26a and 26b serving as heavily doped impurity regions. Here, source and drain regions 26a and 26b will be called a first impurity region. With the annealing process, the impurity ions, doped in second insulating layer 23 and first insulating layer 22 respectively forming the upper portion and lower portion of second gate insulating layer 24, are solid-phase diffused into semiconductor substrate 20, to form second and third impurity regions 27 and 28 in the semiconductor substrate. Second impurity region 27 has conductivity opposite to that of the substrate, and third impurity region 28 has conductivity identical to that of the substrate.

The impurity ions doped in first insulating layer 22 coming into contact with semiconductor substrate 20 are diffused into the substrate, wider and deeper than those doped in second insulating layer 23. Thus, a pocket structured impurity region is formed, in which third impurity region 28 covers second impurity region 27. Second and third impurity regions 27 and 28 have impurity concentration lower (approximately 1/1000) than that of the heavily doped source and drain regions 26a and 26b. Second and third impurity regions 27 and 28 are conventional LDD regions. Second and third impurity regions 27 and 28 are not symmetrically formed in the portions of semiconductor substrate 20, placed on both sides of gate electrode 25a, but formed in a portion under one edge of gate electrode 25a. By doing so, the MOSFET having unsymmetrical LDD region is formed. These unsymmetrical LDD regions (second and third impurity regions 27 and 28) are formed to come into contact with drain region 26b.

Figure 4F:
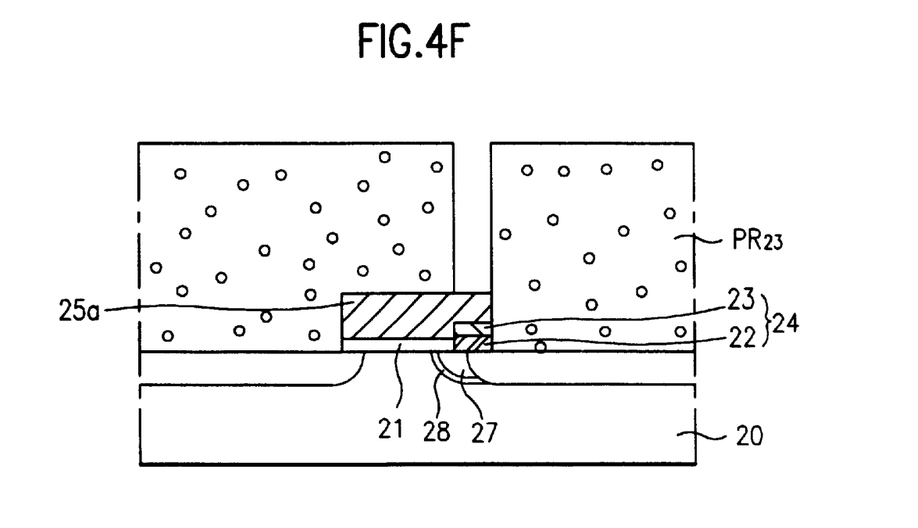
Figure 4G:
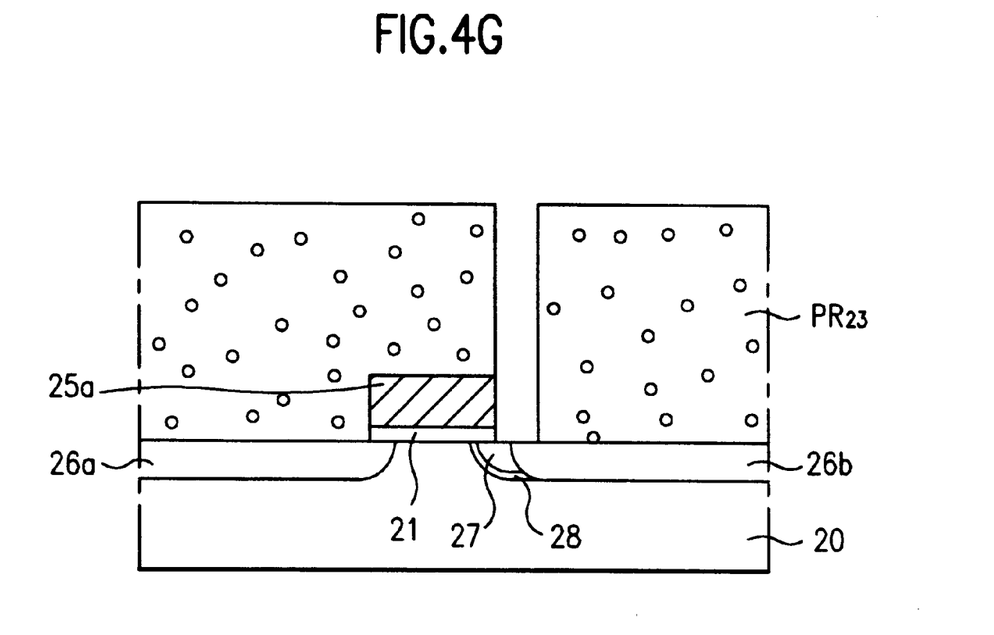
Figure 4H:
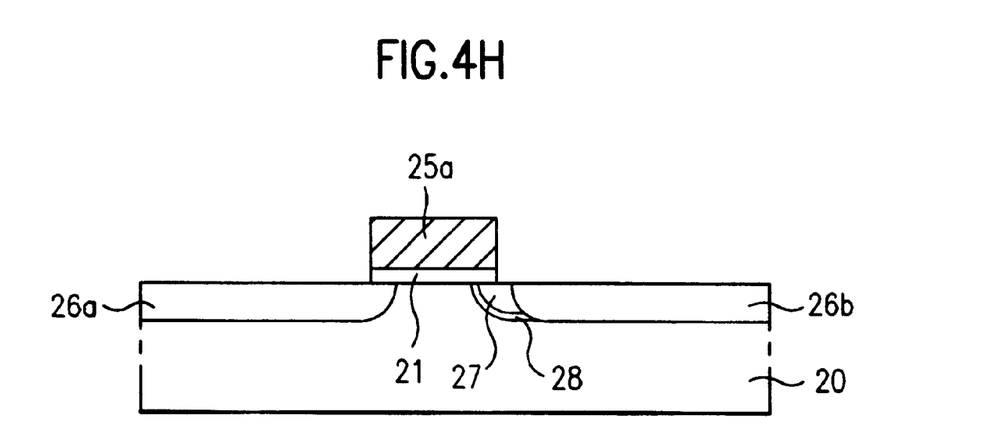

Referring to FIG. 4F, a fourth photoresist layer PR23 is coated on the overall surface of the substrate including gate electrode 25a, and patterned through exposure and development, to expose a portion of gate electrode 25a, placed on second gate insulating layer 24. Referring to FIG. 4G, the portion of gate electrode 25a and second gate insulating layer 24 are removed by etching process using fourth photoresist layer PR23 as a mask. Referring to FIG. 4H, fourth photoresist layer PR23 is removed, to finish the MOSFET according to the second embodiment of the present invention. The process of removing the portion of gate electrode 25a shown in FIGS. 4F, 4G and 4H may be omitted.

According to the present invention, since the LDD region is formed only on the side of the heavily doped impurity region serving as a drain region, not on the source region, the sheet resistance is decreased, thereby improving the driving power and operation speed of the MOS device. Furthermore, ion implantation and tilt ion implantation for forming the LDD region are omitted, increasing the productivity of the device.

It will be apparent to those skilled in the art that various modifications and variations can be made in the semiconductor device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising the steps of:
   forming a first gate insulating layer on a semiconductor substrate, and forming a second gate insulating layer on one side of the first gate insulating layer, the second gate insulating layer being thicker than the first gate insulating layer, wherein the second gate insulating layer includes a first impurity doped insulating layer containing p-type impurities and a second impurity doped insluting layer containing n-type impurities;

forming a gate electrode on the first and second gate insulating layers, a first side of the gate electrode corresponding to the first gate insulating layer and a second side of the gate electrode corresponding to the second gate insulating layer; and forming first impurity regions in the semiconductor substrate on both sides of the gate electrode, and forming a second impurity region in the semiconductor substrate under the second gate insulating layer.

2. The method as claimed in claim 1, wherein the second impurity region is formed between the first impurity regions, and underneath a bottom surface of the second gate insulating layer.

3. The method as claimed in claim 1, wherein the p-type impurities include B and In, and the n-type impurities include P and As.

4. The method as claimed in claim 1, wherein the second gate insulating layer is narrower than the first gate insulating layer.

5. The method as claimed in claim 1, wherein impurities contained in one of the first and second impurity doped insulating layers are solid-phase diffused into the semiconductor substrate, to form the second impurity region having a concentration lower than that of the first impurity region.

6. The method as claimed in claim 5, wherein impurities contained in the other one of the first and second impurity doped insulating layers are solid-phase diffused into the semiconductor substrate, to form a third impurity region in a portion of the substrate, which comes into contact with the second impurity region, the third impurity region having a concentration lower than that of the first impurity region.

7. The method as claimed in claim 6, wherein the second impurity region has a conductivity type opposite to that of the semiconductor substrate, and the third impurity region has a conductivity type identical to that of the semiconductor substrate.

8. The method as claimed in claim 1, wherein the first impurity region has a conductivity type opposite to that of the semiconductor substrate.

9. The method as claimed in claim 1, further comprising the step of removing the second gate insulating layer entirely and a portion of the gate electrode, over the second gate insulating layer.

* * * * *